United States Patent
Weng (10) Patent No.: US 11,367,724 B2
(45) Date of Patent: Jun. 21, 2022

(54) METHOD FOR MANUFACTURING FIN FIELD-EFFECT TRANSISTOR AND FIN FIELD-EFFECT TRANSISTOR STRUCTURE

(71) Applicant: Shanghai Huali Integrated Circuit Corporation, Shanghai (CN)

(72) Inventor: Wenyin Weng, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 24 days.

(21) Appl. No.: 17/107,002

(22) Filed: Nov. 30, 2020

(65) Prior Publication Data

US 2022/0093599 A1   Mar. 24, 2022

(30) Foreign Application Priority Data

Sep. 21, 2020   (CN) .......................... 202010992718.9

(51) Int. Cl.
| | |
|---|---|
| *H01L 27/092* | (2006.01) |
| *H01L 21/8234* | (2006.01) |
| *H01L 29/66* | (2006.01) |
| *H01L 29/78* | (2006.01) |

(52) U.S. Cl.
CPC .. *H01L 27/0924* (2013.01); *H01L 21/823431* (2013.01); *H01L 29/66795* (2013.01); *H01L 29/7851* (2013.01)

(58) Field of Classification Search
CPC ......... H01L 27/0924; H01L 21/823431; H01L 29/66795; H01L 29/7851
See application file for complete search history.

(56) References Cited

U.S. PATENT DOCUMENTS

| | | | |
|---|---|---|---|
| 9,911,736 B1* | 3/2018 | Zang | ................ H01L 29/66545 |
| 2017/0148682 A1* | 5/2017 | Basker | .............. H01L 21/32133 |
| 2019/0131428 A1* | 5/2019 | Huang | .............. H01L 21/82345 |

\* cited by examiner

*Primary Examiner* — Christine A Enad
(74) *Attorney, Agent, or Firm* — Alston & Bird LLP (57) ABSTRACT

A method for manufacturing a fin field-effect transistor is provided, comprising making metal gates, a gate dielectric layer, and a work function layer of the metal gate structures, followed by removing a portion of the end of each of the metal gates that protrudes from a fin region. Since the work function layer is already formed by the removing step, the process window of the work function layer is not affected. Therefore, a relatively large edge region of the metal gates can be removed, thereby minimizing the parasitic capacitance Cgs between the gate and the source or parasitic capacitance Cgd between the gate and the drain of a fin field-effect transistor device in operation. Meanwhile this step simplifies and compatible with the finFET process.

8 Claims, 9 Drawing Sheets

METHOD FOR MANUFACTURING FIN FIELD-EFFECT TRANSISTOR AND FIN FIELD-EFFECT TRANSISTOR STRUCTURE

CROSS-REFERENCES TO RELATED APPLICATIONS

This application claims priority to Chinese patent application No. CN 202010992718.9, filed on Sep. 21, 2020, and entitled "METHOD FOR MANUFACTURING FIN FIELD-EFFECT TRANSISTOR AND FIN FIELD-EFFECT TRANSISTOR STRUCTURE", the disclosure of which is incorporated herein by reference in entirety.

TECHNICAL FIELD

The present application relates to the field of semiconductor integrated circuits (IC), in particular to a manufacturing technology of a fin field-effect transistor.

BACKGROUND

With the continuous development of semiconductor IC technologies, a three-dimensional device such as a fin field-effect transistor (FinFET) has emerged. Compared with planar transistors, the fin field-effect transistor has a three-dimensional channel structure, thus having better turn-on current and turn-off current characteristics, and being capable of improving the short channel effect (SCE). With requirements from market for device performance becoming higher with time, the critical dimensions of devices have reduced constantly. Existing manufacturing methods for fin field-effect transistors can no longer satisfy the needs of the market.

BRIEF SUMMARY OF THE DISCLOSURE

According to some embodiments in this application, a method for manufacturing a fin field-effect transistor is disclosed in the following steps:
S1: forming a plurality of fins on a semiconductor substrate, forming a shallow trench between every adjacent two of the plurality of fins and filling the shallow trench with a first field oxide, wherein a top surface of the first field oxide is configured to be lower than a top surface of each of the plurality of fins, wherein the top surface of each of the plurality of fins is exposed above the first field oxide, wherein the plurality of fins is isolated from each other at a lower part by the first field oxide;
S2: forming a polysilicon layer and forming a plurality of polysilicon gates by a photolithography process and an etching process, wherein the plurality of polysilicon gates intersects with the plurality of fins like a grid, and wherein an overlap region of each of the plurality of polysilicon gates and each of the plurality of fins forms a dummy gate structure;
S3: forming a source region and a drain region on each of the plurality of fins, wherein the source region is located on one side of each of the plurality of polysilicon gates and the drain region is located on the other side of each of the plurality of polysilicon gates;
S4: removing the plurality of polysilicon gates, forming a gate dielectric layer, wherein the gate dielectric layer covers the top surface of each of the plurality of fins and the top surface of the first field oxide; and forming a work function layer, wherein the work function layer covers a surface of the gate dielectric layer;
S5: forming a plurality of metal gates in a region where the plurality of polysilicon gates is removed, wherein the plurality of metal gates, the plurality of fins, the gate dielectric layer, and the work function layer are configured into one of a plurality of metal gate structures of the fin field-effect transistor;
S6: forming a first groove by removing an edge region of ends of the plurality of metal gates that protrude from a region containing the plurality of fins, and disposing a first dielectric layer in the first groove; and
S7: forming a zero-metal layer to connect out the source region and the drain region, wherein the source region and drain region combined with the plurality of metal gate structures are further configured into the fin field-effect transistor.

In some cases, in step S6, the edge region of ends of the plurality of metal gates that protrude from a region containing the plurality of fins is removed by photolithography and etching.

In some cases, a material of the first dielectric layer is silicon nitride.

In some cases, wherein a material of the first dielectric layer is silicon dioxide.

In some cases, the gate dielectric layer comprises a material having high dielectric constant.

In some cases, an extending direction of the plurality of polysilicon gates is perpendicular to an extending direction of the plurality of fins.

According to another embodiment, a fin field-effect transistor structure comprises:
a semiconductor substrate, a plurality of fins formed on the semiconductor substrate, a shallow trench configured between every two adjacent fins of the plurality of fins, wherein the shallow trench is filled with a first field oxide, wherein a top surface of the first field oxide is lower than a top surface of each of the plurality of fins, wherein the plurality of fins are exposed above the first field oxide, and wherein the first field oxide isolates a lower part of each of the plurality of fins from each other;
a plurality of metal gates, wherein the plurality of metal gates intersect with the plurality of fins, wherein an overlap region of each of the plurality of metal gates and each of the plurality of fins forms a metal gate structure, wherein each of the plurality of metal gate covers a surface of the plurality of fins in the overlap region, and wherein each of the plurality of metal gates further covers the top surface of the first field oxide;
a gate dielectric layer disposed among the plurality of metal gates, the region of the plurality of fins, and the first field oxide, wherein the first field oxide is covered by the plurality of metal gates;
a work function layer disposed between the gate dielectric layer and the plurality of metal gates;
a source region and a drain region formed on each of the plurality of fins, wherein the source region is disposed on one side of each of the plurality of metal gate structures and the drain region is disposed on another side of each of the plurality of metal gate structures;
a zero-metal layer disposed on the source region and the drain region for interconnection, wherein each of the plurality of metal gate structures and the source region and the drain region on both sides of the fin field-effect transistor; and
a groove is formed at the end of each of the plurality of metal gates and wherein a dielectric layer is disposed directly on the first field oxide and adjacent to each of the plurality of metal gates.

In some cases, the groove is located in the edge region of ends of the plurality of metal gates that protrude from the region containing the plurality of fins.

DETAILED DESCRIPTION OF THE DISCLOSURE

The technical solution of the present application will be clearly and completely described below with reference to the drawings. Obviously, the described embodiments are part of the embodiments of the present application, instead of all of them. Based on the embodiments in the present application, all other embodiments obtained by one skilled in the art without contributing any inventive labor shall fall into the protection scope of the present application.

Spatial relationship terms, such as "under", "below", "lower", "beneath", "over", and "upper", etc., can be used herein for convenience of description, so as to describe the relationship between one element or feature shown in the figure and other element or feature. It should be understood that, in addition to the orientation shown in the drawing, the spatial relationship terms are intended to further include different orientations of a device in use and operation. For example, if the device in the drawing is turned over, then elements or features described as "below other element" or "under other element" or "beneath other element" will be oriented "above" the other element or feature. Therefore, the exemplary terms "below" and "under" may include both upper and lower orientations. The device can be oriented in other direction (rotated by 90 degrees or in other orientation) and spatial terms used herein are interpreted accordingly.

The terms used herein are only intended for describing the specific embodiments, instead of limiting the present application. When used herein, the singular forms "a", "one", and "the/said" are also intended to include plural forms, unless otherwise indicated in the context clearly. It should also be understood that the terms "consisting of" and/or "including", when used in the Description, determine the existence of the described features, integers, steps, operations, elements, and/or components, but do not exclude the existence or addition of one or more other features, integers, steps, operations, elements, components, and/or groups. When used herein, the term "and/or" includes any and all combinations of related items listed.

Figure 1A:
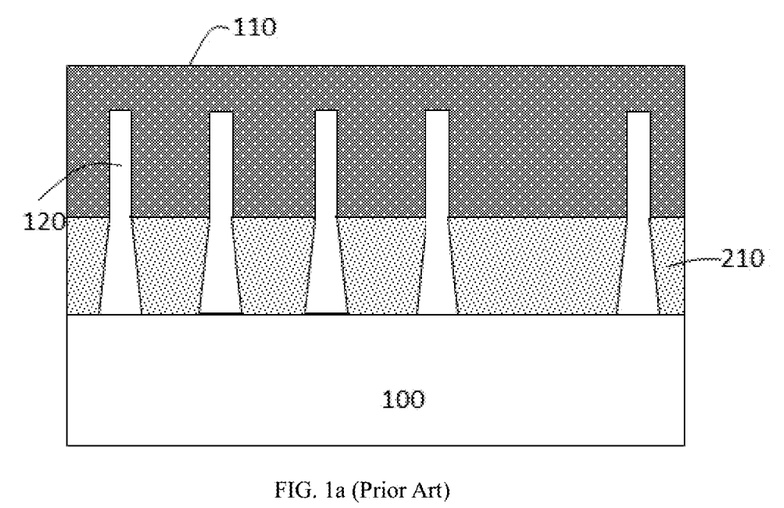
FIGS. 1a-1e are schematic cross-sectional views of a fin field-effect transistor device sectioned along a polysilicon gate or a metal gate fabricated in an existing process.
Figure 1B:
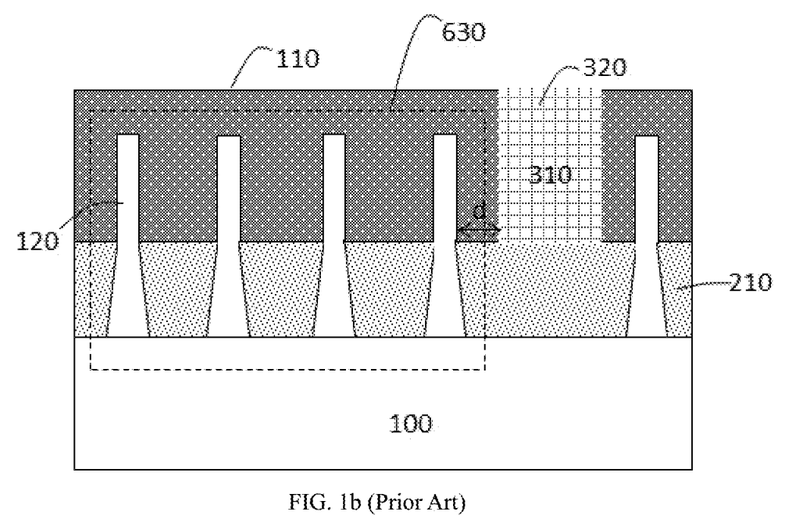
Figure 1C:
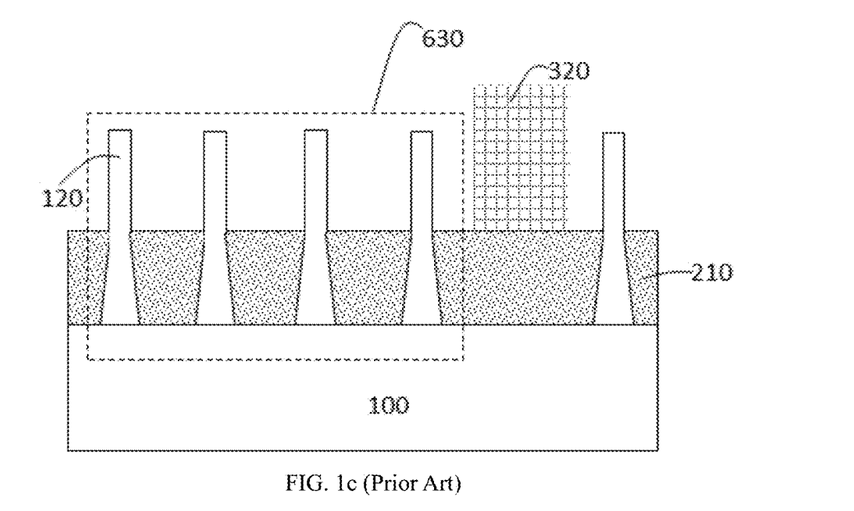
Figure 1D:
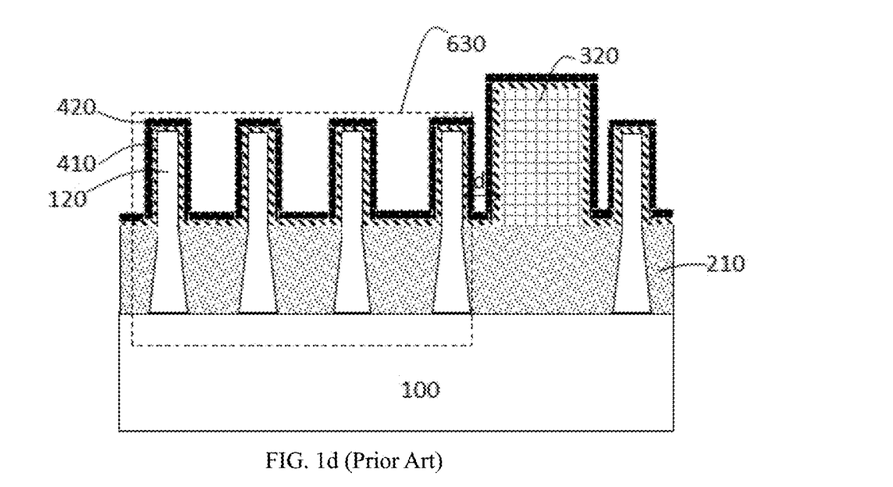
Figure 1E:
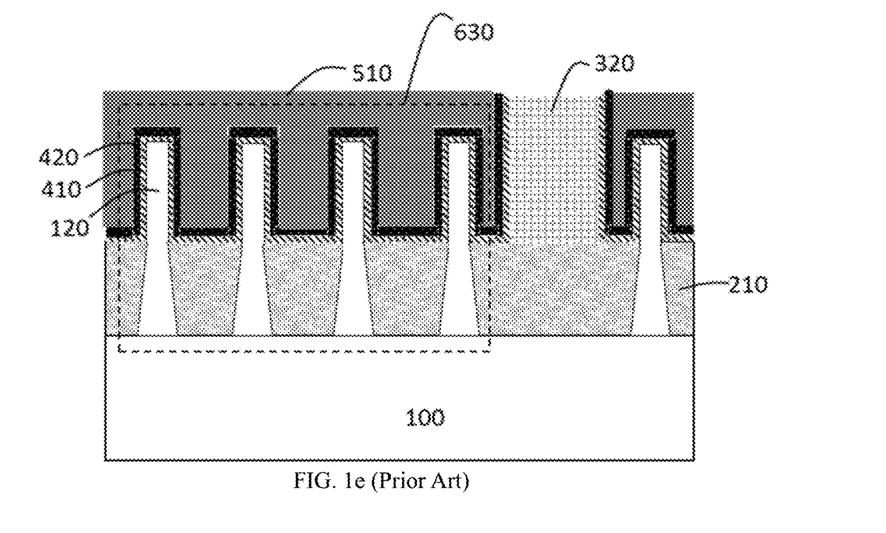

Please refer to FIGS. 1a to 1e, and FIGS. 2a-2d. FIGS. 1a and 1e are schematic cross-sectional views of a fin field-effect transistor device sectioned along a polysilicon gate or a metal gate fabricated in an existing process. FIGS. 2a-2d are schematic planar views of the fin field-effect transistor device fabricated in the existing process. FIG. 1a shows the cross-sectional view of the transistor device sectioned along line AA in FIG. 2a. FIG. 1b shows the schematic cross-sectional view of the transistor device sectioned along line AA in FIG. 2c. FIG. 1e is a schematic cross-sectional view of the transistor device sectioned along line AA in FIG. 2d. An existing method for manufacturing a fin field-effect transistor includes the following steps: S1: referring to FIG. 1a, a plurality of fins 120 are formed on a semiconductor substrate 100, wherein between every two adjacent fins 120, there is a shallow trench filled with a first field oxide 210, and a top surface of the first field oxide 210 is lower than a top surface of the fins 120 such that the fins 120 are exposed above the top surface of the first field oxide 210, so as to isolate the lower parts of the fins 120 from each other by means of the first field oxide 210; S2: referring to FIGS. 2a and 1a, a polysilicon layer is formed, to pattern the polysilicon layer, a photolithography process followed by an etching process is performed to form the plurality of polysilicon gates 110, wherein the polysilicon gates 110 intersect with the fins 120. An overlap region 150 of each of the polysilicon gates 110 and each of the fins 120 forms a dummy gate structure, in each of the overlapping region 150, the polysilicon gate 110 overlays the top surface and the side surfaces of the beneath fin 120, and a region of the fin 120 underneath the polysilicon gate 110 forms a channel region; S3: referring to FIGS. 2b and 1b, the ends of the polysilicon gates 110 protrude from a fin region 630 and form partially overlapping regions 610 and 620, these partially overlapping regions are removed to form a first groove 310, followed by a dielectric layer 320 filling in the first groove 310; S4: referring to FIG. 2c, a source region 141 and a drain region 142 are formed on each of the fins 120, wherein the source region 141 is located on one side of the polysilicon gate 110 and the drain region 142 is located on the other side of the polysilicon gate 110; S5: referring to FIG. 1c, which shows the structure after the polysilicon gate is removed; S6: referring to FIG. 1d, a gate dielectric layer 410 is formed, the gate dielectric layer 410 covers the top surface and side surfaces of the fin 120, the top surface and side surfaces of the dielectric layer 320, and the remaining exposed surfaces of the first field oxide 210, and a work function layer 420 is formed, covering the surface of the gate dielectric layer 410; S7: referring to FIG. 1e, a metal gate 510 is formed, wherein the metal gate 510 fills a region from which the polysilicon gates are removed, the metal gate 510, the fin 120, the gate dielectric layer 410, and the work function layer 420 form a metal gate structure of the fin field-effect transistor, so the metal gate structure, the source region and the drain region form the fin field-effect transistor; and S8: referring to FIG. 2d, a zero metal layer 130 is formed to lead out the source region 141 and the drain region 142.

Figure 2A:
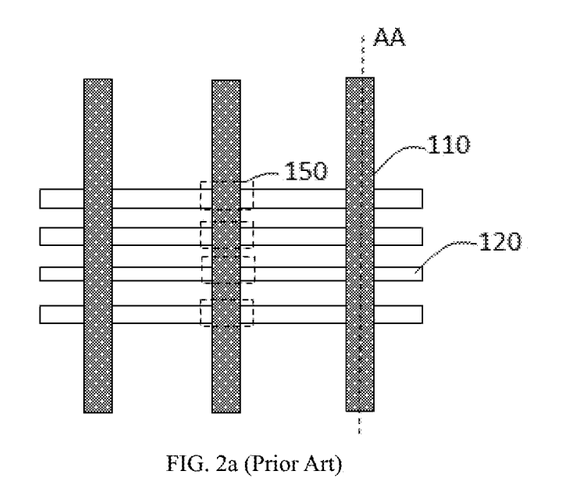
FIGS. 2a-2d are schematic planar views of a fin field-effect transistor device fabricated in the existing process.
Figure 2B:
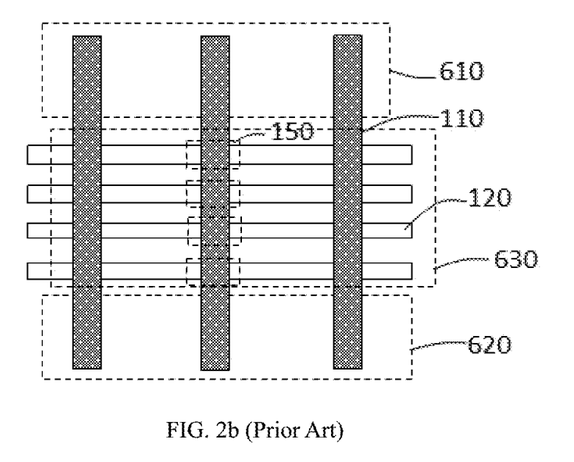
Figure 2C:
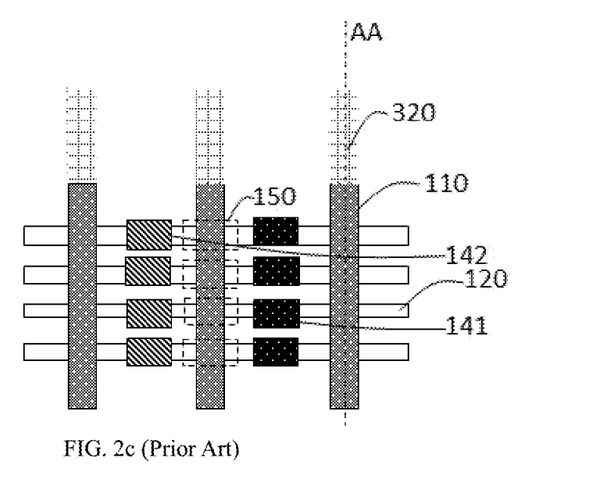
Figure 2D:
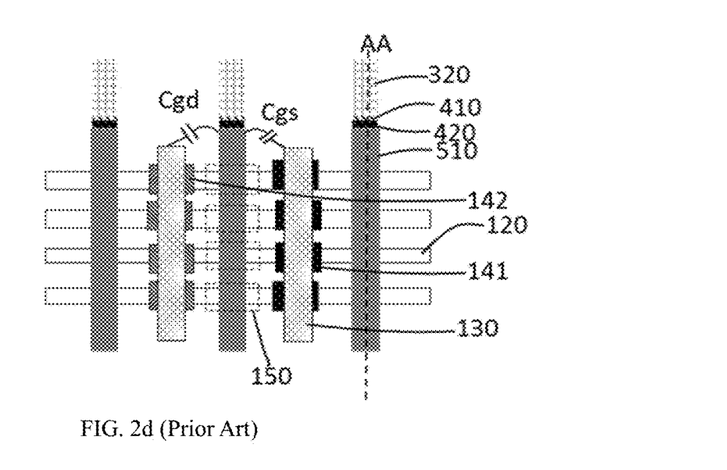

However, in the above-described existing method for manufacturing a fin field-effect transistor, if the removed partial regions 610 and 620 at the protruding ends of the polysilicon gates 110 are excessively large, referring to FIG. 1b, a distance d between the dielectric layer 320 and the adjacent fin 120 thereto is relatively small, resulting in a very small filling process window for the work function layer 420 in the subsequent step S6, referring to FIG. 1d, and the small filling process window thereby affects device yield; and if the removed partial regions 610 and 620 at the protruding ends of the polysilicon gates 110 are excessively small, parasitic capacitance Cgs between the gate and the source region 141 or parasitic capacitance Cgd between the gate and the drain region 142 of the finally formed fin field-effect transistor device will be undesirably large, thereby affecting the device performance also, referring to FIG. 2d. Therefore, the existing common method for manufacturing a fin field-effect transistor requires a tight balance between the proper filling windows of the work function layer yet minimizing the parasitic capacitance.

The above-described fin region 630 is a region where the fins 120 of the fin field-effect transistor are located on the semiconductor substrate.

Figure 3A:
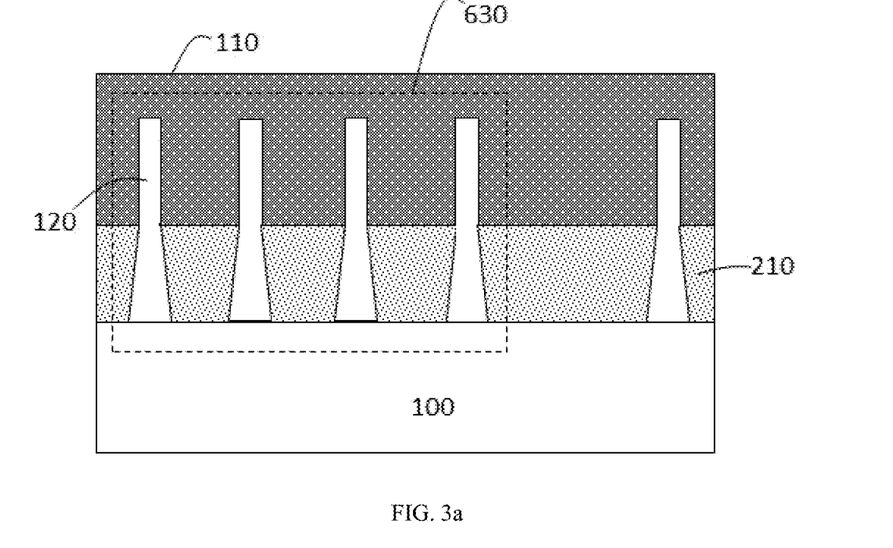
FIGS. 3a-3d are schematic cross-sectional views of a fin field-effect transistor device sectioned along a polysilicon gate or a metal gate fabricated in a process according to one embodiment of the present application.
Figure 3B:
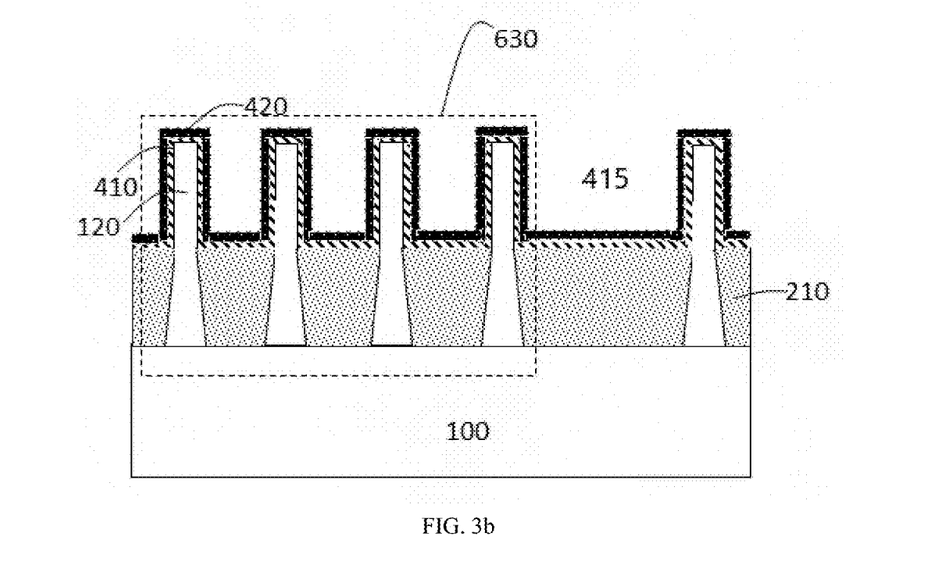
Figure 3C:
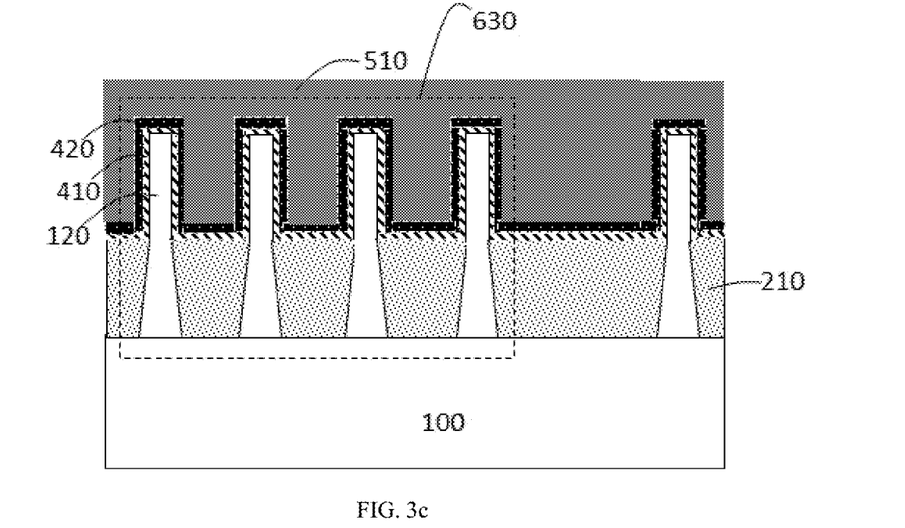
Figure 3D:
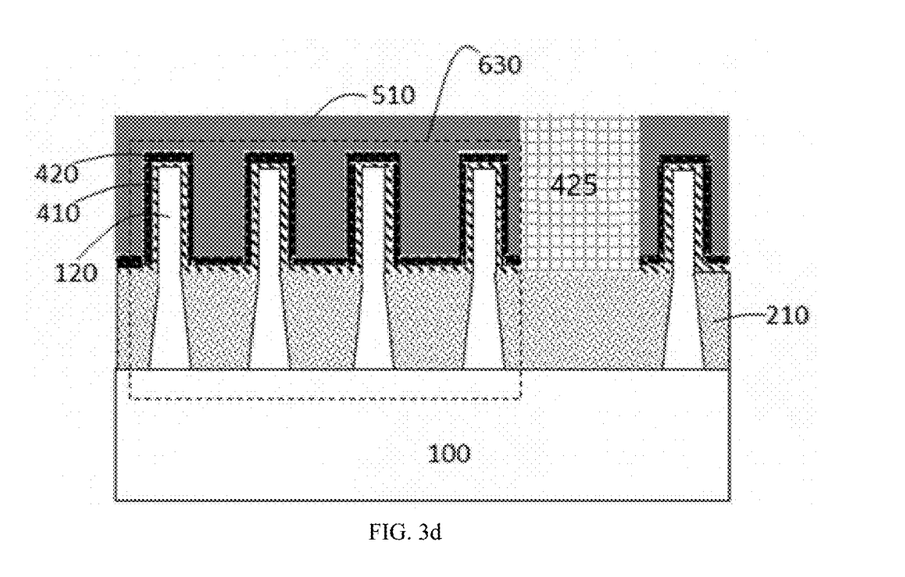

FIGS. 3a-3d and FIGS. 4a-4d illustrate a method for fabricating a fin field-effect transistor according to some embodiments of the present application. FIGS. 3a-3d show schematic cross-sectional views of a fin field-effect transistor device sectioned along a polysilicon gate or a metal gate during its manufacturing process. FIGS. 4a-4d show schematic planar views of the fin field-effect transistor device during the manufacturing process. FIG. 3a shows the cross-sectional view of the transistor device sectioned along line AA in FIG. 4a. FIG. 3d is the schematic cross-sectional view of the transistor device sectioned along line AA in FIG. 4d. The method for manufacturing the fin field-effect transistor according to some embodiments of the present application includes the following steps.

Figure 4A:
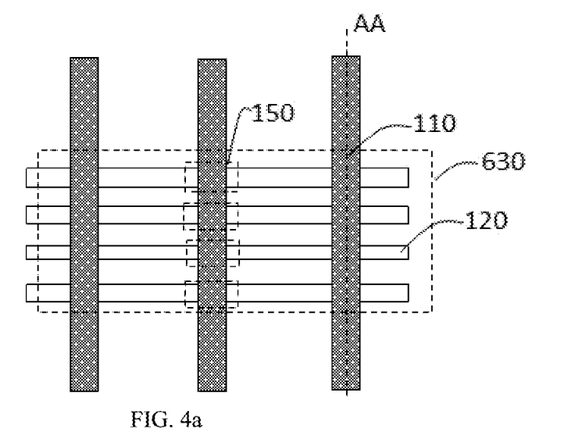
FIGS. 4a-4d are schematic planar views of a fin field-effect transistor device fabricated in a process according to another embodiment of the present application.

S1: In FIGS. 3a and 4a, a plurality of fins 120 are formed on a semiconductor substrate 100, and a shallow trench layer fills in between the adjacent fins 120 with a first field oxide 210 layer. The top surface of the first field oxide 210 is lower than the top surface of the fins 120 such that the fins 120 are exposed above top of the first field oxide 210, therefore the lower parts of the fins 120 are isolated from each other by the first field oxide 210.

In an embodiment, the semiconductor substrate 100 can be a silicon substrate or a silicon-on-insulators (SOI) substrate. In an embodiment, the first field oxide 210 is deposited by means of a flowable chemical vapor deposition (FCVD) process; after the first field oxide 210 is deposited, planarization and etching processes are further performed on the first field oxide, so that the top surface of the first field oxide is etched back to be lower than the top surface of the fins 120.

S2: Referring to FIGS. 3a and 4a, a polysilicon layer is formed, and a patterning process including photolithography and etching is performed to form a plurality of polysilicon gates 110, wherein the polysilicon gates 110 intersect with the fins 120, and an overlapping region 150 between the polysilicon gate 110 and the fin 120 forms a dummy gate structure.

In an embodiment, an extension direction of the polysilicon gate 110 is perpendicular to an extension direction of the fin 120, both along the substrate.

Referring to FIG. 4a, the ends of the plurality of polysilicon gates 110 protrude out from a fin region 630, and the protruding portion is relatively long. Generally, the portion of the end of the polysilicon gate 110 that protrudes from the fin region 630 needs to be removed, in order to reduce any parasitic capacitance Cgs occurring between the metal gate and the source or the drain region of the fin field-effect transistor device formed consequently.

Figure 4B:
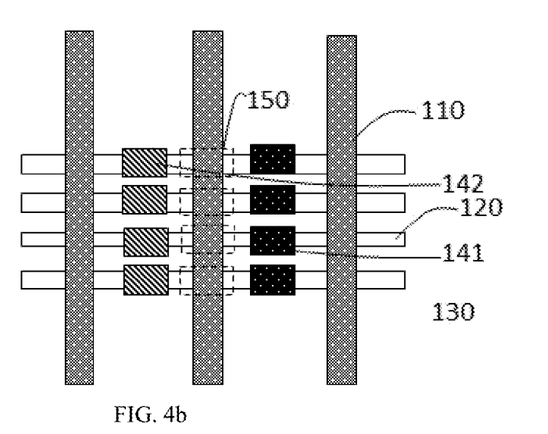

S3: Referring to FIG. 4b, a source region 141 and a drain region 142 are formed on each of the fins 120, wherein the source region 141 is located on one side of the polysilicon gate 110 and the drain region 142 is located on the other side of the polysilicon gate 110.

In an embodiment, the formation of the source region 141 and the drain region 142 further specifically includes steps of: forming a second groove on the fin on both sides of the dummy gate structure, filling the second groove with an embedded epitaxial layer, and performing ion implantation in the embedded epitaxial layer to form the source region 141 and the drain region 142 respectively. If the fin transistor is an N-type device, the material of the embedded epitaxial layer is silicon phosphate (SiP); and if the fin transistor is a P-type device, the material of the embedded epitaxial layer is silicon germanium (SiGe).

S4: Referring to FIG. 3b, the polysilicon gate 110 is removed, a gate dielectric layer 410 is formed on the surface of the fin 120 and the surface of the first field oxide 210, and a work function layer 420 is formed covering the surface of the gate dielectric layer 410.

In an embodiment, the gate dielectric layer 410 includes a dielectric layer with a high dielectric constant, the materials of the dielectric layer include, but not limited to, silicon dioxide, silicon nitride, aluminum oxide, tantalum pentoxide, yttrium oxide, hafnium silicate oxygen compound, hafnium dioxide, lanthanum oxide, zirconium dioxide, strontium titanite, and zirconium silicate oxygen compound.

S5: Referring to FIG. 3c, a metal gate 510 is formed, which fills a region from which the polysilicon gate 110 was removed, the metal gate 510, the fin 120, the gate dielectric layer 410, and the work function layer 420 constitute a metal gate structure of the fin field-effect transistor.

Figure 4C:
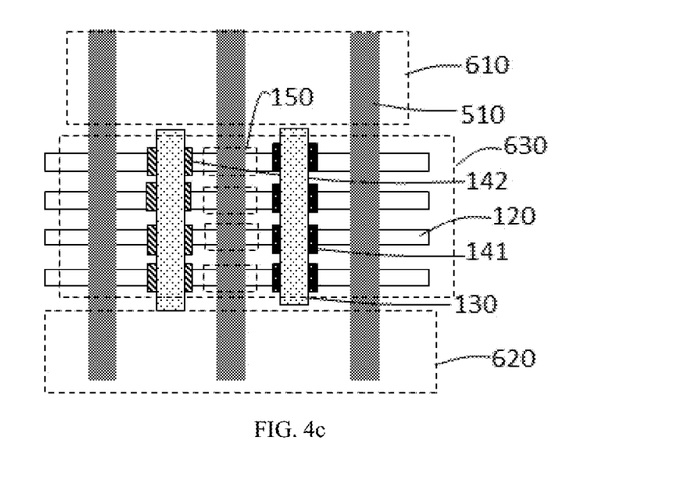

S6: Referring to FIGS. 4c and 3d, edge regions 610 and 620 having the protruding ends of the metal gate 510 from the fin region 630 are removed, a first groove 415 is formed, and a dielectric layer 425 is filled into the first groove 415.

In an embodiment, the material of the dielectric layer 425 includes a dielectric such as silicon dioxide, silicon oxynitride, or silicon nitride.

In an embodiment, the edge regions 610 and 620 having the protruding ends of the metal gate 510 from the fin region 630 are removed by means of a photolithography process and an etching process.

Figure 4D:
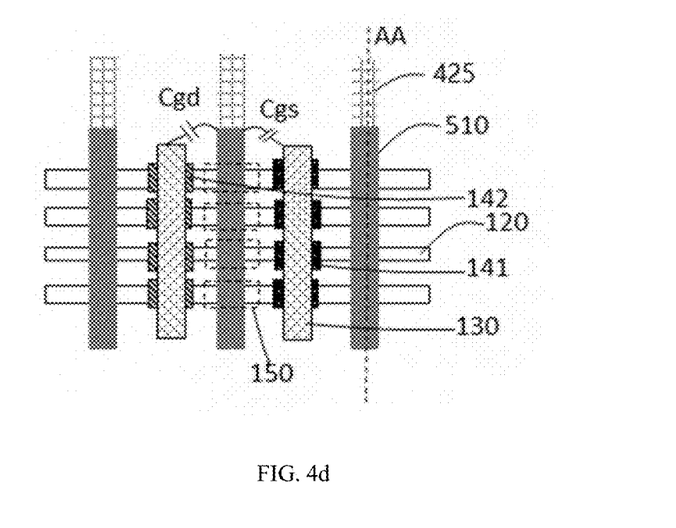

S7: Referring to FIG. 4d, a zero-metal layer 130 is formed to lead out the source region 141 and the drain region 142, wherein the metal gate structure and the source region 141 and drain region 142 form the fin field-effect transistor. In these figures, there are columns of sources and drains alike, reference numbers 141 and 142 only point to one area of source or drain as examples for simplicity.

The above-described fin region 630 is an area where the fins 120 are located.

As stated above, in the present application, after the metal gate, the gate dielectric layer, and the work function layer of the metal gate structure are formed in steps S1-S5, a portion of each of the metal gate ends that protrude from the fin region is removed in step S6. Since the work function layer is already formed by the previous steps, the work function layer's process window is no longer an limiting factor. Therefore, a relatively large edge region of the metal gates can be removed, thereby minimizing parasitic capacitance Cgs between the gate and the source and parasitic capacitance Cgd between the gate and the drain in the fin field-effect transistor device during operation. Therefore, applying the method for fabricating the fin field-effect transistor according to the present application, the parasitic capacitance between the gate and the source and the drain can be minimized while satisfying the process window for the work function layer. Compared with the existing method for making a fin field-effect transistor, no additional new process is required, thereby the process is simple and compatible.

Another embodiment of the present application provides a fin field-effect transistor structure, referring to FIG. 3d and FIG. 4d. FIG. 3d is a schematic cross-sectional view of a fin field-effect transistor sectioned along a metal gate. FIG. 4d is a schematic planar view of the fin field-effect transistor, for details. As shown in FIGS. 3d and 4d, the fin field-effect transistor structure includes: a semiconductor substrate 100, a plurality of fins 120 formed on the semiconductor substrate 100, a shallow trench configured between the adjacent fins 120 for isolation, the shallow trench is filled with a first field oxide 210, here the top surface of the first field oxide 210 is made lower than the top surface of the fins 120 such that the fins 120 are exposed above the first field oxide 210, so as to isolate the lower parts of the fins 120 from each other by means of the first field oxide 210; a plurality of metal gates 510, wherein the plurality of metal gates 510 intersect with the plurality of fins 120, an overlap region 150 of the metal gate 510 and the fin forms a metal gate structure, the metal gate 510 covers the surface of the fin 120 in the overlap region 150, and the plurality of metal gates 510 cover the surface of the first field oxide 210; a gate dielectric layer 410 located between the plurality of metal gates 510 and a region of the fin 120 and the first field oxide 210 which is covered by the plurality of metal gates 510; and a work function layer 420 located between the gate dielectric layer 410 and the metal gate 510, wherein a source region 141 and a drain region 142 of a fin field-effect transistor are formed on the fin, the source region 141 is located on one side of the metal gate structure and the drain region 142 is located on the other side of the metal gate structure, the source region 141 and the drain region 142 are connected to a zero-metal layer 130, so that the metal gate structure and the source region 141 and the drain region 142 on both sides thereof form the fin field-effect transistor. The ends of the metal gate 510 of the fin field-effect transistor is provided with a groove 415, the groove is filled with a dielectric layer 425, the dielectric layer 425 is in direct contact with and covers the first field oxide 210, and two sidewalls of the dielectric layer 420 are adjacent to the metal gate 510.

In some embodiments, the lower surface of the dielectric layer 420 directly contacts and covers the first field oxide 210, and the two sidewalls of the dielectric layer 420 are in direct contact with the metal gate 510. In another example, the groove 415 is formed by performing a photolithography process and an etching process on the edge region of the ends of the metal gate 510 protruding from a fin region 630, followed by filling the groove 415 with the dielectric layer 425.

More specifically, the groove 415 is located in an edge region of the ends of the metal gate 510 protruding from a fin region 630. The above-described fin region 630 is a region where the fins 120 are located.

In some examples, the material of the dielectric layer 425 is an oxide such as silicon dioxide, silicon nitride, and silicon oxynitride.

Finally, it should be noted that the above embodiments are used only for illustration of the technical solutions of the present application, but not for limitation. Although the present application has been described in detail with reference to the foregoing embodiments, those skilled in the art should understand that, they can still modify the technical solutions described in the foregoing embodiments, or make equivalent replacement for some or all of the technical features therein; and these modifications or replacements do not cause the essence of the corresponding technical solutions to deviate from the scope of the technical solutions in the embodiments of the present application.

What is claimed is:
1. A method for manufacturing a fin field-effect transistor, comprising steps of:
S1: forming a plurality of fins on a semiconductor substrate,
forming a shallow trench between every adjacent two of the plurality of fins and filling the shallow trench with a first field oxide, wherein a top surface of the first field oxide is configured to be lower than a top surface of each of the plurality of fins, wherein the top surface of each of the plurality of fins is exposed above the first field oxide, wherein the plurality of fins is isolated from each other at a lower part by the first field oxide;
S2: forming a polysilicon layer and forming a plurality of polysilicon gates by a photolithography process and an etching process, wherein the plurality of polysilicon gates intersects with the plurality of fins like a grid, and wherein an overlap region of each of the plurality of polysilicon gates and each of the plurality of fins forms a dummy gate structure;
S3: forming a source region and a drain region on each of the plurality of fins, wherein the source region is located on one side of each of the plurality of polysilicon gates and the drain region is located on the other side of each of the plurality of polysilicon gates;
S4: removing the plurality of polysilicon gates, forming a gate dielectric layer, wherein the gate dielectric layer covers the top surface of each of the plurality of fins and the top surface of the first field oxide; and
forming a work function layer, wherein the work function layer covers a surface of the gate dielectric layer;
S5: forming a plurality of metal gates in a region where the plurality of polysilicon gates is removed, wherein the plurality of metal gates, the plurality of fins, the gate dielectric layer, and the work function layer are configured into one of a plurality of metal gate structures of the fin field-effect transistor;
S6: performing a photolithography process and an etching process to form a first groove by removing an edge region of ends of the plurality of metal gates that protrude from a region containing the plurality of fins, and disposing a first dielectric layer in the first groove, wherein the first dielectric layer in the first groove is in direct contact with the plurality of the metal gates on sidewalls of the first groove and the first field oxide at a bottom surface of the first groove; and
S7: forming a zero-metal layer to connect out the source region and the drain region, wherein the source region and drain region combined with the plurality of metal gate structures are further configured into the fin field-effect transistor.

2. The method for manufacturing the fin field-effect transistor according to claim 1, wherein a material of the first dielectric layer is silicon nitride.

3. The method for manufacturing the fin field-effect transistor according to claim 1, wherein a material of the first dielectric layer is silicon dioxide.

4. The method for manufacturing the fin field-effect transistor according to claim 1, wherein the gate dielectric layer comprises a dielectric layer, comprising a material having a high dielectric constant such as silicon dioxide, silicon nitride, aluminum oxide, tantalum pentoxide, yttrium oxide, hafnium silicate oxygen compound, hafnium dioxide, lanthanum oxide, zirconium dioxide, strontium titanite, and zirconium silicate oxygen compound.

5. The method for manufacturing the fin field-effect transistor according to claim 1, wherein an extending direction of the plurality of polysilicon gates is perpendicular to an extending direction of the plurality of fins.

6. A device fabricated by the method according to claim 1.

7. The fin field-effect transistor structure according to claim 6, wherein two sidewalls of the dielectric layer are adjacent to the plurality of metal gates.

8. The fin field-effect transistor structure according to claim 6, wherein the first groove is located in the edge region of ends of the plurality of metal gates that protrude from the region containing the plurality of fins.

* * * * *